(12) United States Patent
Tamonoki et al.

(10) Patent No.: US 8,513,879 B2
(45) Date of Patent: Aug. 20, 2013

(54) DISPLAY APPARATUS, MANUFACTURING METHOD OF DISPLAY APPARATUS, AND ELECTRONIC DEVICE

(75) Inventors: Shinya Tamonoki, Aichi (JP); Hiroshi Sagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 422 days.

(21) Appl. No.: 12/699,470

(22) Filed: Feb. 3, 2010

(65) Prior Publication Data

US 2010/0201262 A1 Aug. 12, 2010

(30) Foreign Application Priority Data

Feb. 10, 2009 (JP) ................................. 2009-028050

(51) Int. Cl.
*H01J 1/53* (2006.01)
(52) U.S. Cl.
USPC ......................................................... 313/505
(58) Field of Classification Search
USPC ................................................. 313/502–506
See application file for complete search history.

(56) References Cited

U.S. PATENT DOCUMENTS

| | | |
|---|---|---|
| 2003/0094615 A1 | 5/2003 | Yamazaki et al. |
| 2008/0197778 A1 | 8/2008 | Kubota |
| 2008/0246403 A1 | 10/2008 | Sagawa et al. |
| 2009/0026932 A1* | 1/2009 | Kwak et al. .................... 313/504 |
| 2009/0102760 A1* | 4/2009 | Yamashita et al. .............. 345/76 |

FOREIGN PATENT DOCUMENTS

| | | |
|---|---|---|
| EP | 1 492 388 A2 | 12/2004 |
| EP | 2 019 432 A2 | 10/2012 |
| JP | 2008-257086 | 10/2008 |

OTHER PUBLICATIONS

European Search Report issued on Jul. 18, 2012, in connection with counterpart EP Application No. 10 15 2465.

* cited by examiner

*Primary Examiner* — Anh Mai
*Assistant Examiner* — Brenitra M Lee
(74) *Attorney, Agent, or Firm* — Dentons US LLP

(57) ABSTRACT

A display apparatus includes: a display region provided with a plurality of pixel portions; wires installed to the respective pixel portions within the display region from an outside of the display region and transmitting a signal to drive the respective pixel portions; connection pads provided on the outside of the display region and serving as input portions that provide the wires with a signal while electrically conducting with the wires; switch elements provided on the outside of the display region in a middle of the wires; and a light shielding covering portion shielding the switch elements from light and formed to cover the connection pads while electrically conducting with the connection pads.

8 Claims, 21 Drawing Sheets

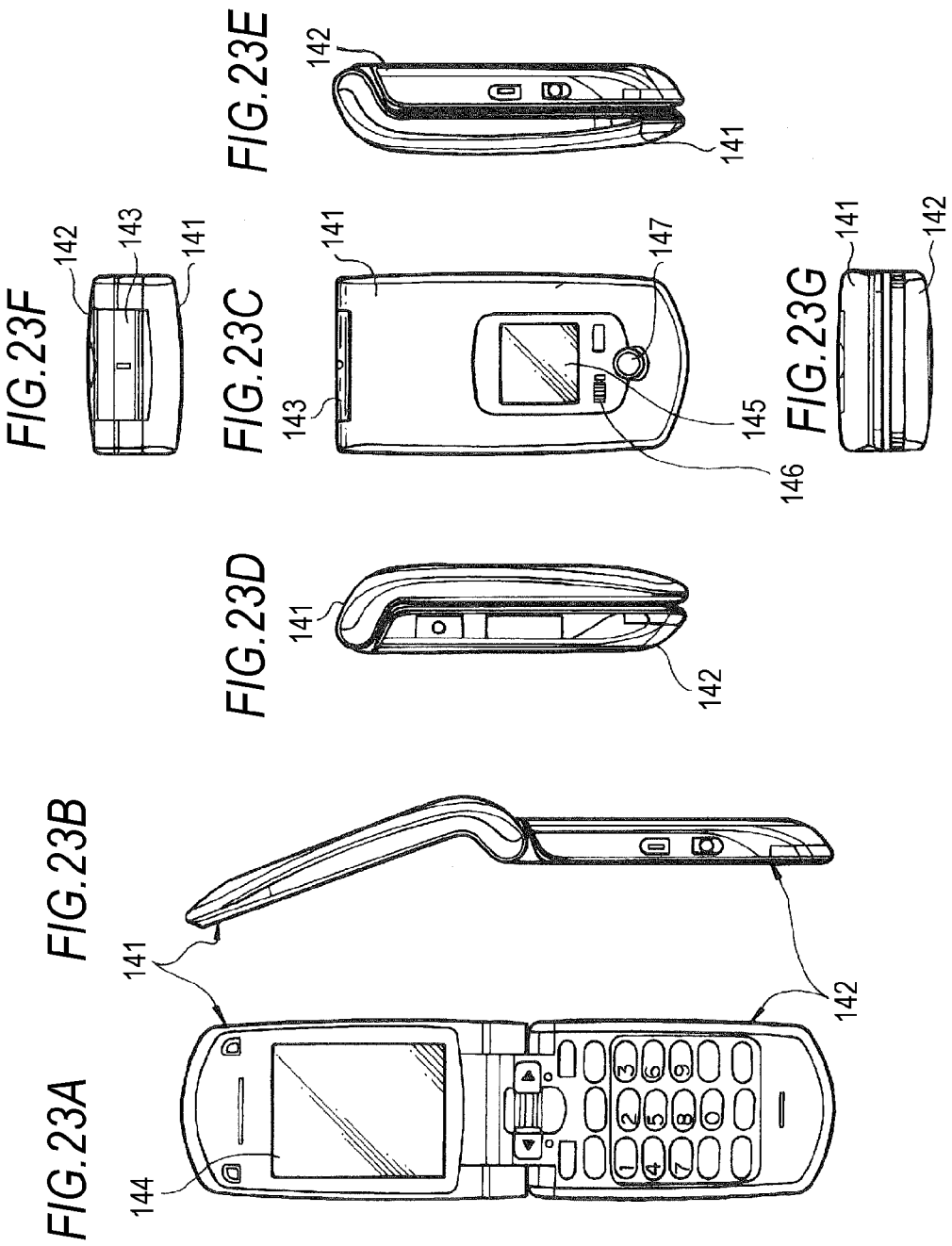

DISPLAY APPARATUS, MANUFACTURING METHOD OF DISPLAY APPARATUS, AND ELECTRONIC DEVICE

BACKGROUND OF THE INVENTION

1. Field of the Invention

The present invention relates to a display apparatus, a manufacturing method of a display apparatus, and an electronic device, and more particularly, to a display apparatus, a manufacturing method of a display apparatus, and an electronic device each of which is configured not to give adverse influences of processing in the fabrication sequence to the electrode surfaces of pixels.

2. Description of the Related Art

An organic EL (Electro Luminescence) panel displays a video by supplying a current to respective pixels each having a vapor deposited organic electroluminescence layer or the like from the side or top or bottom of the panel by way of metal wires as is described, for example, in JP-A-2008-257086. When an organic EL panel becomes larger, necessary luminance of pixels increases and so does a current to be supplied. Also, because one wire becomes longer, wiring resistance becomes higher, which makes a voltage drop from the current supply end larger.

This voltage drop raises problems, such as the occurrence of non-uniform luminance and an increase of power consumption. Accordingly, a low resistance material is used for the current supply metal layer with the aim at suppressing a voltage drop. Examples of a low resistance metal include but not limited to aluminum (Al), copper (Cu), gold (Au), and silver (Ag). Of these candidates, Cu has a problem that it is quite difficult to form a wire from Cu whereas Au and Ag have a problem that they are expensive. In view of the foregoing, Al is often used as metal for low resistance wires.

Al can be processed by either wet etching or dry etching and is inexpensive. In a case where a single-layer Al wire is used, however, there is a concern about the generation of defects, such as hillock and spike.

The term, "hillock", referred to herein means a semispherical protrusion generated on the wire surface due to heat history in the fabrication process. The term, "spike", referred to herein means a phenomenon that Al enters into silicon (Si) when Al is subjected to heat treatment while in contact with Si.

As a countermeasure against these defects, there is a laminated structure to sandwich an Al wire between heat-resistant high melting point metal. As a consequence, a metal layer aimed at anti-hillock and anti-spike appears on the surface of the top metal layer when Al is used as a current supply metal layer.

A current flown through the current supply metal layer is injected into an organic electroluminescence layer by way of electrodes of pixels. It is therefore necessary for the electrodes of pixels to have a characteristic that they are capable of injecting a current into the organic electroluminescence layer. Normally, ITO (Indium Tin Oxide) having a high work function is used as a hole injecting electrode. As a consequence, metal with a high capability of injecting holes into the organic electroluminescence layer appears on the surface of a metal layer used as the electrodes of pixels.

SUMMARY OF THE INVENTION

An insulating film (opening defining insulating film) defining openings of pixels is formed by the steps of applying photosensitive resin followed by exposure and peeling (development). When the opening defining insulating film is peeled, pad portions for connecting anode electrodes and external wires (for example, flexible cables) are soaked in a peeling liquid at the same time. A battery corrosion reaction thus takes place and the surface nature of the anode electrodes is deteriorated. Deterioration of the surface nature of the anode electrodes lowers the reflectance, which in turn lowers the luminance of pixels.

Thus, it is desirable to provide a technique of preventing adverse influences of processing in the fabrication sequence from being given to electrodes of pixels.

According to an embodiment of the present invention, there is provided a display apparatus including a display region provided with a plurality of pixel portions, wires installed to the respective pixel portions within the display region from an outside of the display region and transmitting a signal to drive the respective pixel portions, connection pads provided on the outside of the display region and serving as input portions that provide the wires with a signal while electrically conducting with the wires, switch elements provided on the outside of the display region in a middle of the wires, and a light shielding covering portion shielding the switch elements from light and formed to cover the connection pads while electrically conducting with the connection pads.

According to another embodiment of the present invention, there is provided an electronic device having a main body casing provided with the display apparatus configured as above.

According to the embodiments of the present invention, the light shielding covering portion that shields the switch elements from light is provided to cover the connection pads while electrically conducting with the connection pads that electrically conduct with the wires. It is therefore possible to protect the surfaces of the connection pads with the light shielding covering portion.

In a case where the pixel portion includes an organic electroluminescence layer interposed between the anode electrode and the cathode electrode, by making the light shielding covering portion out of the same material as the anode electrode, it becomes possible to prevent the battery effect from being generated in the developing step carried out while the anode electrode is in an exposed state.

According to still another embodiment of the present invention, there is provided a manufacturing method of a display apparatus including the steps of forming transistors for each pixel on a substrate, covering the transistors with a first insulating film and planarizing a surface of the first insulating film, forming a second insulating film defining openings of respective pixels between every two adjacent pixels on the first insulating film, forming anode electrodes in the openings of the respective pixels defined by the second insulating film, forming an organic electroluminescence layer on the anode electrodes, and forming a cathode electrode on the electroluminescence layer.

According to this embodiment of the present invention, the second insulating film that defines openings of the respective pixels is formed first and thence the anode electrodes are formed in the openings. It thus becomes possible to prevent the influences in the step of forming the second insulating film from being given to the anode electrodes.

According to the embodiments of the present invention, it becomes possible to prevent the adverse influences of the processing in the fabrication sequence from being given to the electrodes of pixels, which can in turn prevent deterioration of the display performance of the pixels.

BRIEF DESCRIPTION OF THE DRAWINGS

FIG. 23A through FIG. 23G are views showing a mobile terminal device, for example, a mobile phone, to which the present invention is applied.

DESCRIPTION OF THE PREFERRED EMBODIMENT

Hereinafter, a mode for embodying the present invention (hereinafter, referred to as the embodiment) will be described in the following order:

1. Overall configuration of display apparatus (examples of planar configuration, circuit configuration, configuration of protection circuit, configuration of test switch circuit)

2. Configuration of light shielding covering portion (examples of protection circuit portion and test switch circuit portion)

3. Sectional structure of light shielding covering portion (examples of connection pad portion and switch element portion)

4. Planar configuration of light shielding covering portion (examples of routing and connection pad portion and another example of light shielding covering portion)

5. Manufacturing method of display apparatus (example of forming anode electrode after formation of opening defining insulating film)

6. Application Examples (examples of electronic device).

1. Overall Configuration of Display Apparatus

Planar Configuration

Figure 1:
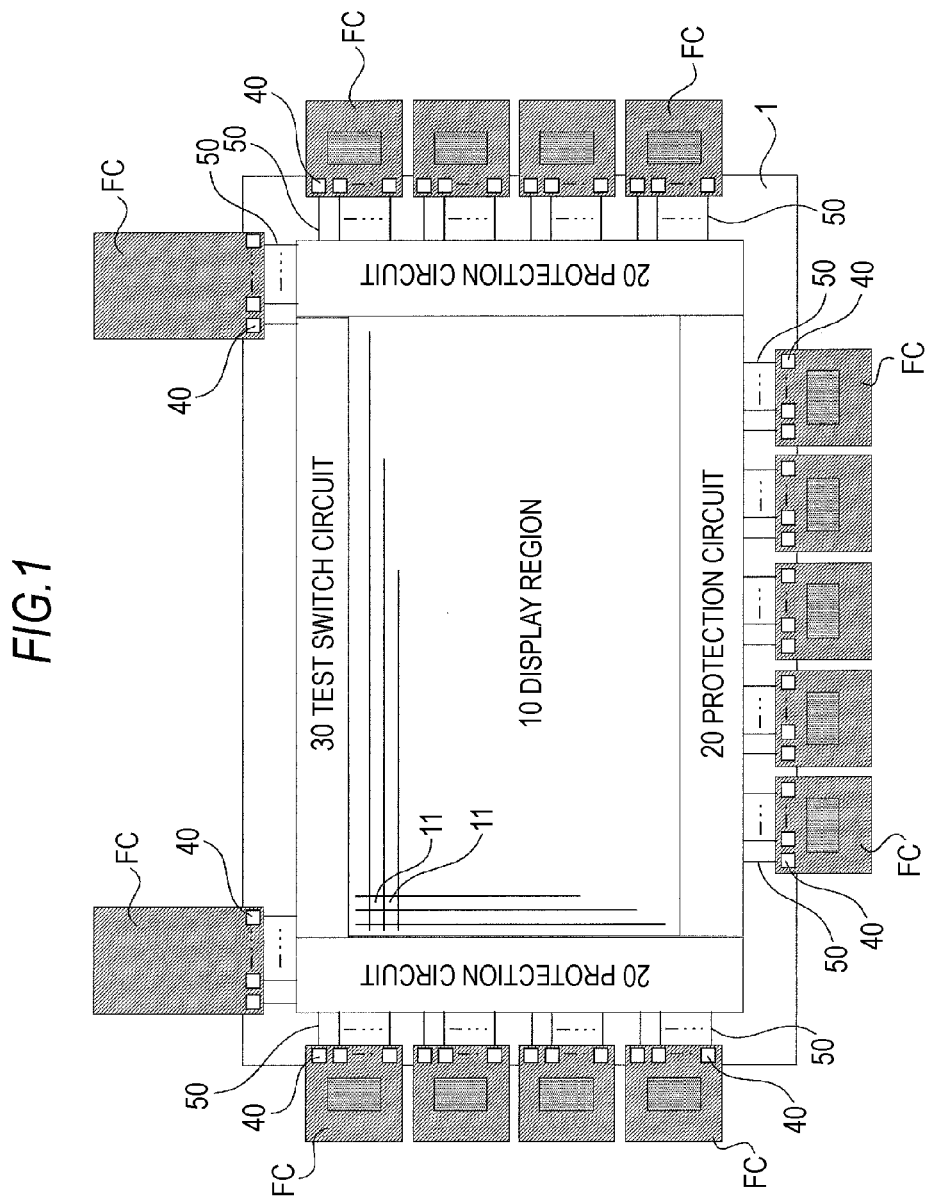
FIG. 1 is a view used to describe the planar configuration of a display apparatus according to an embodiment of the present invention.

FIG. 1 is a view used to describe a planar configuration of a display apparatus according to this embodiment. More specifically, the display apparatus according to this embodiment includes a display region 10 provided at substantially the center of a glass substrate 1, protection circuits 20 and a test switch circuit (performance test circuit) 30 provided on the periphery of the display region 10 on the glass substrate 1, and connection pads 40 connected to a power and respective conductor lines of cables (for example, flexible cables FC) through which to input various signals from the outside.

A plurality of pixel portions 11 are disposed horizontally and vertically in a matrix fashion within the display region 10. Each pixel portion 11 is provided with a modulation layer (for example, an organic electroluminescence layer) that modulates light according to a video signal and is also provided with a plurality of TFTs (Thin Film Transistors) that drive respective pixels. The TFTs can be, for example, a write transistor for a vide signal and a drive transistor for driving the modulation layer in a pixel according to a video signal.

Wires 50 are installed in the display region 10 for the respective pixels from outside to inside. The wires 50 are provided in a lattice-like arrangement so as to correspond to spaces among the pixels arrayed horizontally and vertically. The wires 50 include scan lines through which to input a signal that sequentially selects write transistors of the pixels row by row, power supply control lines through which to provide the drive transistors of the pixels with a control signal of a power supply voltage, signal lines through which to provide the drive transistors of the pixels with a signal for display (video signal), and power supply feed lines through which to feed a power supply voltage.

The respective wires 50 are routed to the connection pads 40 provided on the outer peripheral portion of the glass substrate 1, which is outside the display region 10. Of these wires 50, those serving as the scan lines and the power supply control lines are connected to the protection circuits 20 in the middle of the lines. Each protection circuit 20 includes switch elements provided in the middle of the respective wires 50. In the event of application of a high voltage, such as static electricity, the protection circuit 20 protects the display region 10 by preventing charges from flowing through the wires 50 on the side of the display region 10 using the switch elements.

Of the wires 50, one ends of those serving as the signal lines are connected to the corresponding protection circuit 20 on the outside of the display region 10. Also, the other ends of the signal lines are connected to the test switch circuit 30 on the outside of the display region 10. The test switch circuit 30 includes switch elements used to send a performance test signal to the signal lines when a performance test is conducted. The wires 50 are routed to the connection pads 40 via the protection circuits 20 and the test switch circuit 30 configured as above.

The switch elements provided to the protection circuits 20 and the switch circuit 30 are covered with a light shielding film in order not only to prevent a malfunction triggered by unwanted incident light from the outside but also to inhibit reflected light of outside light from entering into the display region 10.

The display apparatus according to this embodiment is configured in such a manner that the light shielding film that shields the switch elements from light is provided as a light shielding covering portion to cover the connection pads 40 while electrically conducting with the connection pads 40. Owing to this configuration, it becomes possible to protect the surfaces of the connection pads 40 with the light shielding covering portion, which makes it unnecessary to expose a material of the connection pads 40 to the surface in the fabrication sequence after the light shielding covering portion is formed.

In the case of an organic EL display apparatus in which an organic electroluminescence layer is disposed between the anode electrode and the cathode electrode as the pixel portion 11, the light shielding covering portion and the anode electrodes are made of the same material. Owing to this configuration, the connection pads 40 are covered with the light shielding covering portion made of the same material as the anode electrodes. Accordingly, in the developing step carried out while the anode electrodes are in an exposed state, because the exposed material on the connection pads 40 and the exposed material of the anode electrodes are the same, it becomes possible to prevent the generation of the battery effect. In other words, it becomes possible to prevent the surfaces of the anode electrodes from becoming uneven through decomposition because of the battery effect.

Circuit Configuration

Figure 2:
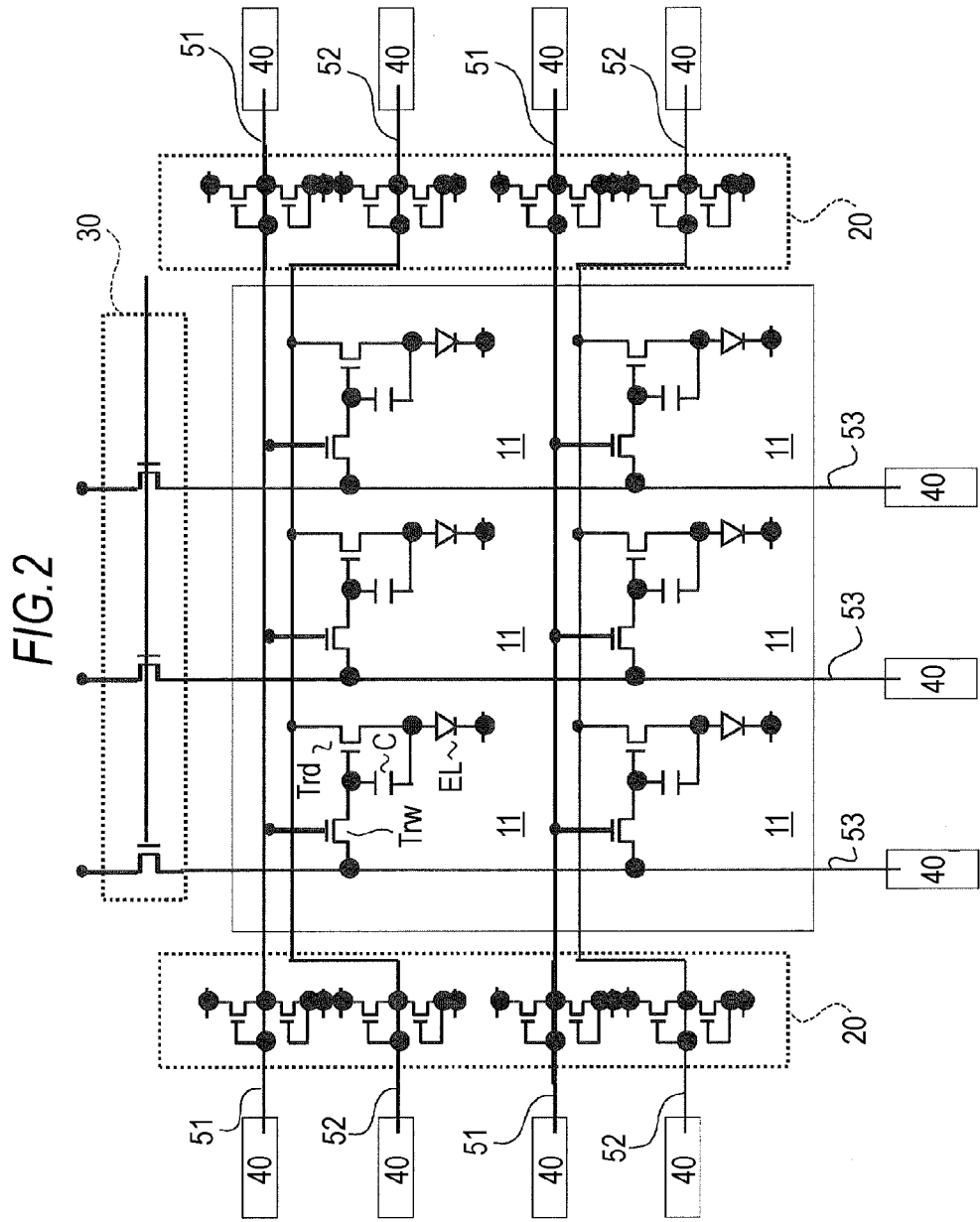
FIG. 2 is a view used to describe the circuit configuration of a major portion of the display apparatus according to the embodiment of the present invention.

FIG. 2 is a view used to describe the circuit configuration of a major portion of the display apparatus according to this embodiment. The circuit configuration shown in FIG. 2 shows a pixel circuit in an organic EL display apparatus. For ease of description, a circuit having a 2×3 matrix of the pixel portions 11 at the center is shown. It should be appreciated, however, that many more pixel portions 11 are provided in practice. In addition, although the protection circuit 20 is provided at one ends of the signal lines and the test switch circuit 30 at the other ends, FIG. 2 shows the test switch circuit 30 at the other ends alone.

More specifically, each pixel portion 11 includes at least one transistor and a capacity. Each pixel portion 11 shown in FIG. 2 is provided with a write transistor Trw, a drive transistor Trd, a retention capacity C, and an organic electroluminescence layer EL. In addition, as the wires 50, signal lines 53 are installed along the column direction between every two adjacent pixel portions 11 and scan lines 51 and power supply control lines 52 are installed along the row directions between every two adjacent pixel portions 11.

Each scan line 51 is connected to the gates of the write transistors Trw of a plurality of the pixel portions 11 arrayed along the row direction. Also, each signal line 53 is connected to the drains of the write transistors Trw of a plurality of the pixel portions 11 arrayed along the column direction. The source of each write transistor Trw is connected to the gate of the corresponding drive transistor Trd. Each power supply control line 52 is connected to the drains of the drive transistors Trd of a plurality of the pixel portions 11 arrayed along the row direction. The source of each drive transistor Trd is connected to the anode electrode of the corresponding organic electroluminescence layer EL. Also, each retention capacity C is connected between the gate and the source of the corresponding drive transistor Trd. Common potential is applied to the cathode electrode of the organic electroluminescence layer EL in each pixel portion 11.

In this embodiment, the connection pads 40 are provided at the both ends of the scan lines 51 and the power supply control lines 52. Also, the protection circuits 20 are provided to the scan lines 51 and the power supply control lines 52 on the outside of the display region 10 in the middle of the respective lines 51 and 52 all the way up to the connection pads 40. The connection pads 40 are provided at one ends of the signal lines 53 and the test switch circuit 30 is provided at the other ends.

In order to perform a display operation with the circuit configuration as above, a selection signal is applied sequentially to the scan lines 51 and a display by the pixel portions 11 in the selected row is performed sequentially. More specifically, when a selection signal is applied to a scan line 51, the write transistors Trw of the pixel portions 11 connected to this scan line 51 come ON. A video signal corresponding to the pixel portions 11 in the selected row is sent sequentially from the signal lines 53 to the respective pixel portions 11 so that charges corresponding to the video signal are sent to the corresponding retention capacities C from the write transistors Trw that are ON. Further, a voltage corresponding to the video signal is applied to the gates of the drive transistors Trd. In response to this voltage, a voltage is applied to the anode electrodes of the organic electroluminescence layers EL from the power supply control lines 52. Accordingly, a voltage corresponding to the video signal is applied between the anodes and the cathodes and organic electroluminescence light emission is achieved. This operation is performed by the pixel portions 11 connected to the scan lines 51 to which the selection signal is sent sequentially. A video display by the display region 10 is thus achieved.

Configuration of Protection Circuit

Figure 3:
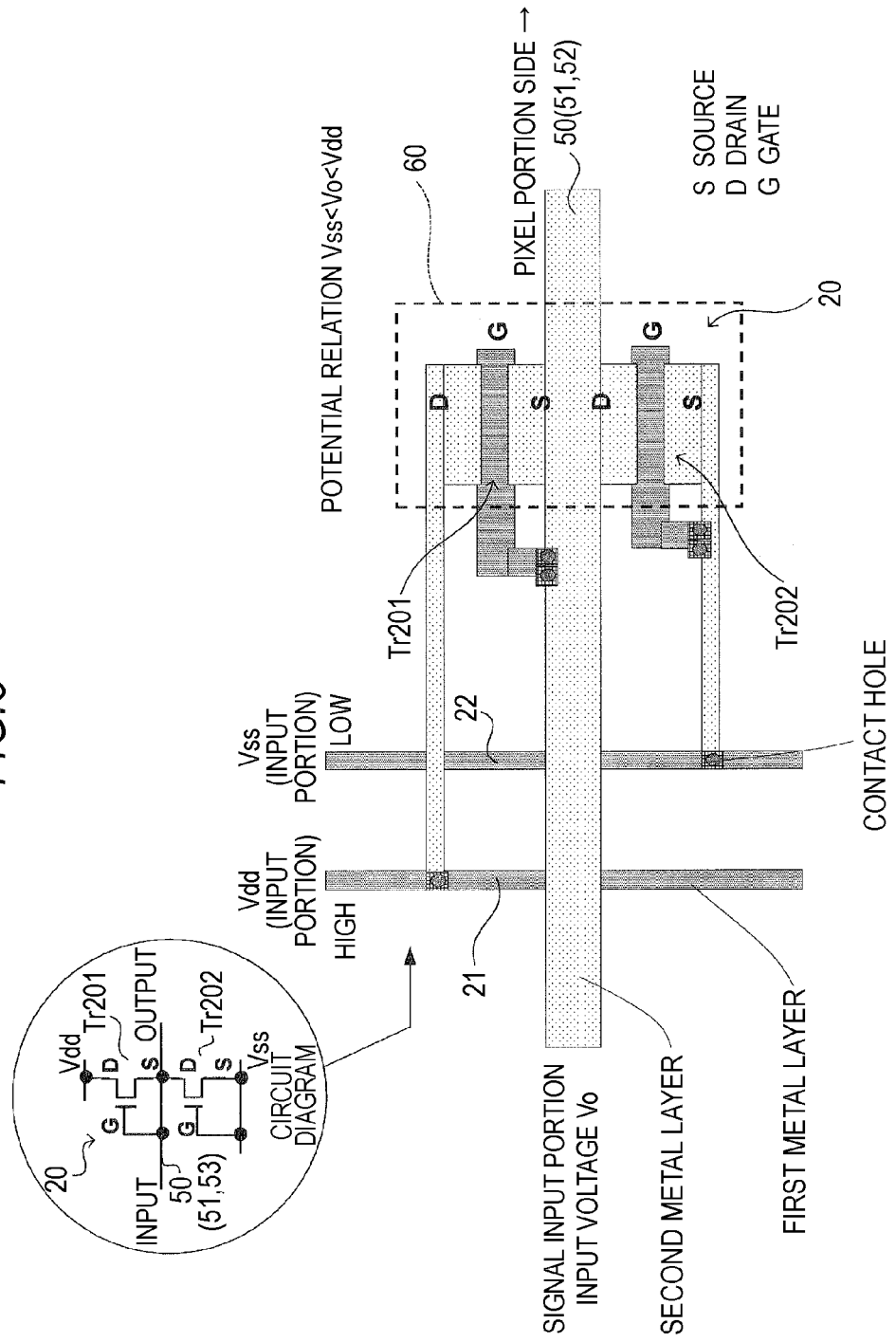
FIG. 3 is a pattern layout view used to describe an example of the configuration of a protection circuit.

FIG. 3 is a pattern layout view used to describe an example of the configuration of the protection circuit 20. As is shown in the circuit diagram in the inset of the drawing, the protection circuit 20 is of a configuration in which two switch elements (transistors Tr201 and Tr202) are connected to the wire 50 (the scan line 51 or the power supply control line 52). Of these two transistors, the drain D of the transistor Tr201 is connected to Vdd and both the gate G and the source S are connected to the wire 50. Also, the drain D of the other transistor Tr202 is connected to the wire 50 and both the gate G and the source S are connected to Vss.

In the pattern layout, the transistor Tr201 is disposed on one side and the other transistor Tr202 is disposed on the other side with the wire 50 in between at the center. Wires 21 and 22 used to apply Vdd and Vss, respectively, are formed as a first metal layer and disposed so as to cross the wire 50 (the scan line 51 or the power supply control line 52). The wire 50 (the scan line 51 or the power supply control line 52) is formed as a second metal layer.

In the pattern layout as above, a light shielding film 60 represented by a frame indicated by a broken line in the drawing is provided on the two transistors Tr201 and Tr202 formed of TFTs in the related art. By providing the light shielding film 60, not only does it become possible to prevent a malfunction triggered by unwanted light coming incident on the transistors Tr201 and Tr202 from the outside, but it also becomes possible to inhibit reflected light of outside light from entering into the display region 10.

Configuration of Test Switch Circuit

Figure 4:
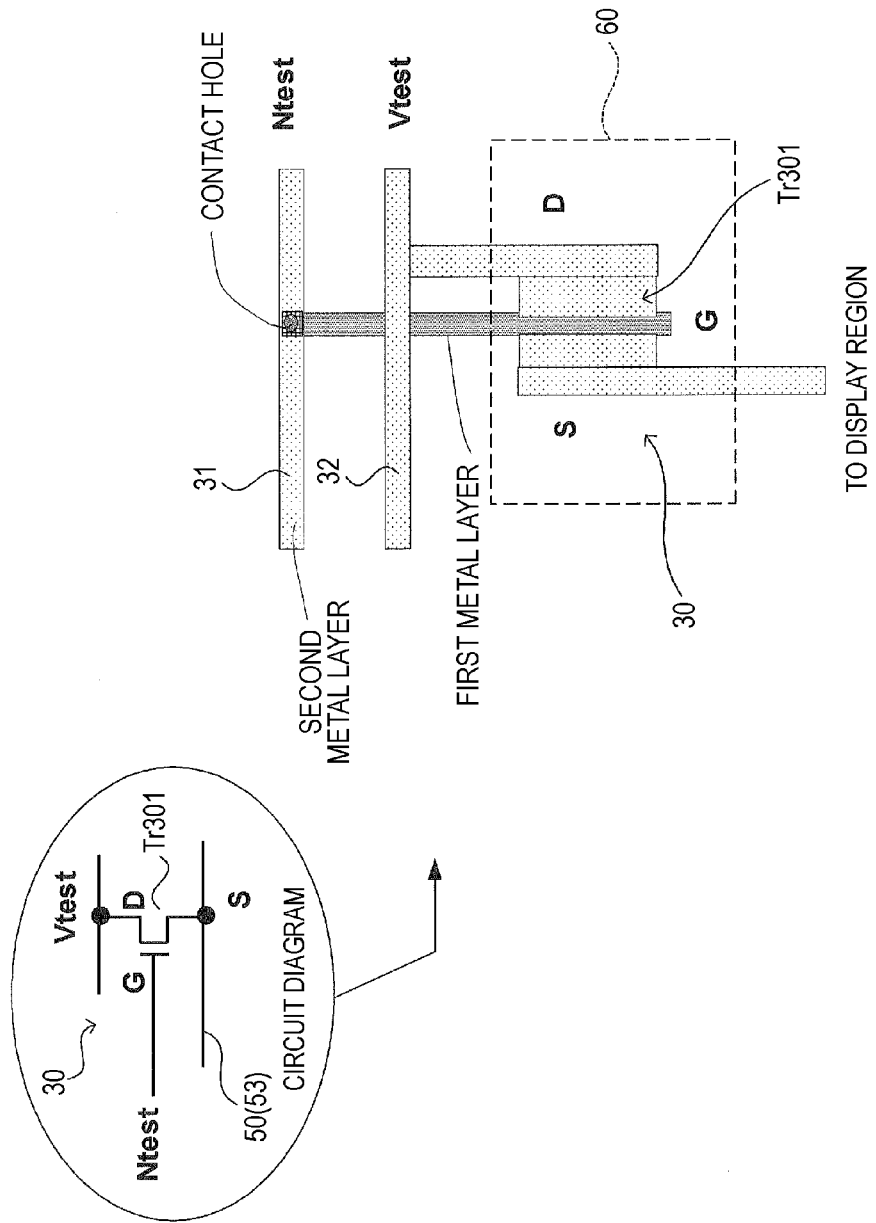
FIG. 4 is a pattern layout view used to describe an example of the configuration of a test switch circuit.

FIG. 4 is a pattern layout view used to describe one example of the configuration of the test switch circuit 30. As is shown in the circuit diagram in the inset of the drawing, the test switch circuit 30 is of a configuration in which a switch element (transistor Tr301) is connected to the wire 50 (signal line 53). The source S of the transistor Tr301 is connected to the wire 50 (signal line 53), the gate G is connected to a test selection line Ntest, and the drain D is connected to a test signal line Vtest.

In the pattern layout, the gate G of the transistor Tr301 is formed as a first metal layer and the wires 50 (signal lines 53) and wires 31 and 32 of the test selection line Ntest and the test signal line Vtest, respectively, are formed as a second metal layer. In order to perform a performance test of the pixel portions 11, the transistor Tr301 is closed by applying a predetermined voltage to the test selection line Ntest and then a test signal supplied from the test signal line Vtest is sent to the wire 50 (signal line 53). Accordingly, the test signal is sent to the circuit forming the pixel portion 11 and an operation test is carried out.

In the pattern layout as above, the light shielding film 60 represented by a frame indicated by a broken line in the drawing is provided on the transistor Tr301 formed of a TFT in the related art. By providing the light shielding film 60, not only does it become possible to prevent a malfunction triggered by unwanted light coming incident on the transistor Tr301 from the outside, but it also becomes possible to inhibit reflected light of outside light from entering into the display region 10.

2. Configuration of Light Shielding Covering Portion Protection Circuit Portion

Figure 5:
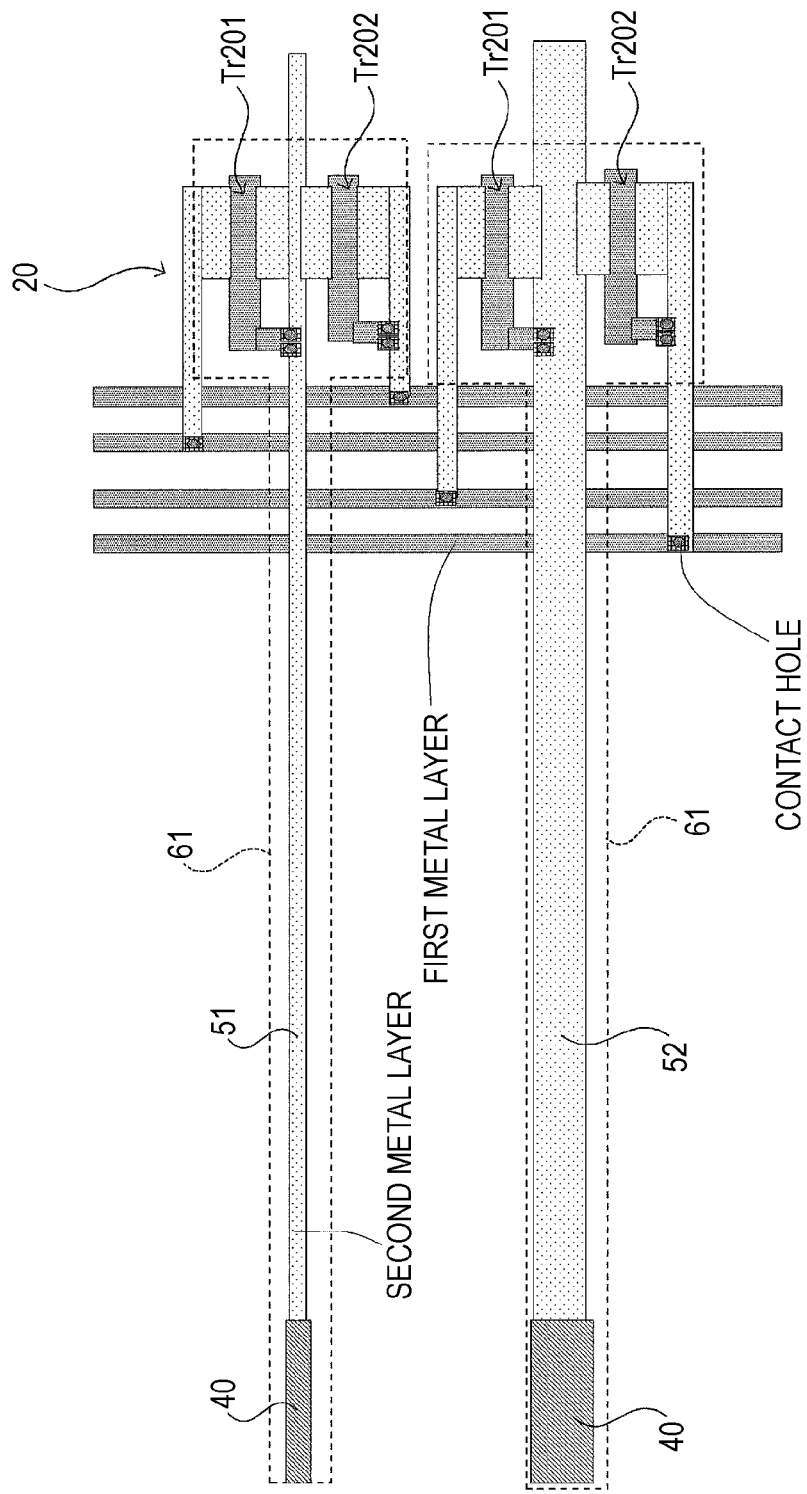
FIG. 5 is a pattern layout view used to describe a light shielding covering portion in a protection circuit portion of the display apparatus according to the embodiment of the present invention.

FIG. 5 is a pattern layout view used to describe a light shielding covering portion in a protection circuit portion of the display apparatus according to this embodiment. As has been described above, the protection circuits 20 having two transistors Tr201 and Tr202 for each line are provided to the scan lines 51 and the power supply control lines 52. Also, the scan lines 51 and the power supply control lines 52 are routed to the connection pads 40 from the display region 10 (not shown) via the protection circuits 20.

In this embodiment, as indicated by a broken line in the drawing, a light shielding covering portion 61 is provided as a light shielding film so as to cover not only every two transistors Tr201 and Tr202 in the protection circuits 20 but also the corresponding connection pad 40 while electrically conducting with the connection pad 40.

By providing the light shielding covering portion 61 in this manner, not only does it become possible to shield every two transistors Tr201 and Tr202 in the protection circuits 20, but it also becomes possible to prevent the potential of the light shielding covering portion 61 from floating. Also, by providing the light shielding covering portion 61 on the connection pad 40, it becomes possible to prevent the material of the connection pad 40 from undergoing the fabrication sequence in an exposed state.

Herein, the light shielding covering portion 61 is made of the same material in the same layer as the anode electrode, which is one of the electrodes that apply a voltage to the organic electroluminescence layer of the pixel portion 11. Owing to this configuration, the exposed material (the material of the light shielding covering portion 61) electrically conducting with the connection pad 40 is the same as the material of the anode electrode in the developing step carried out while the anode electrode is in an exposed state. It is therefore possible to prevent the battery effect from being generated in the developing step or the like.

Test Switch Circuit Portion

Figure 6:
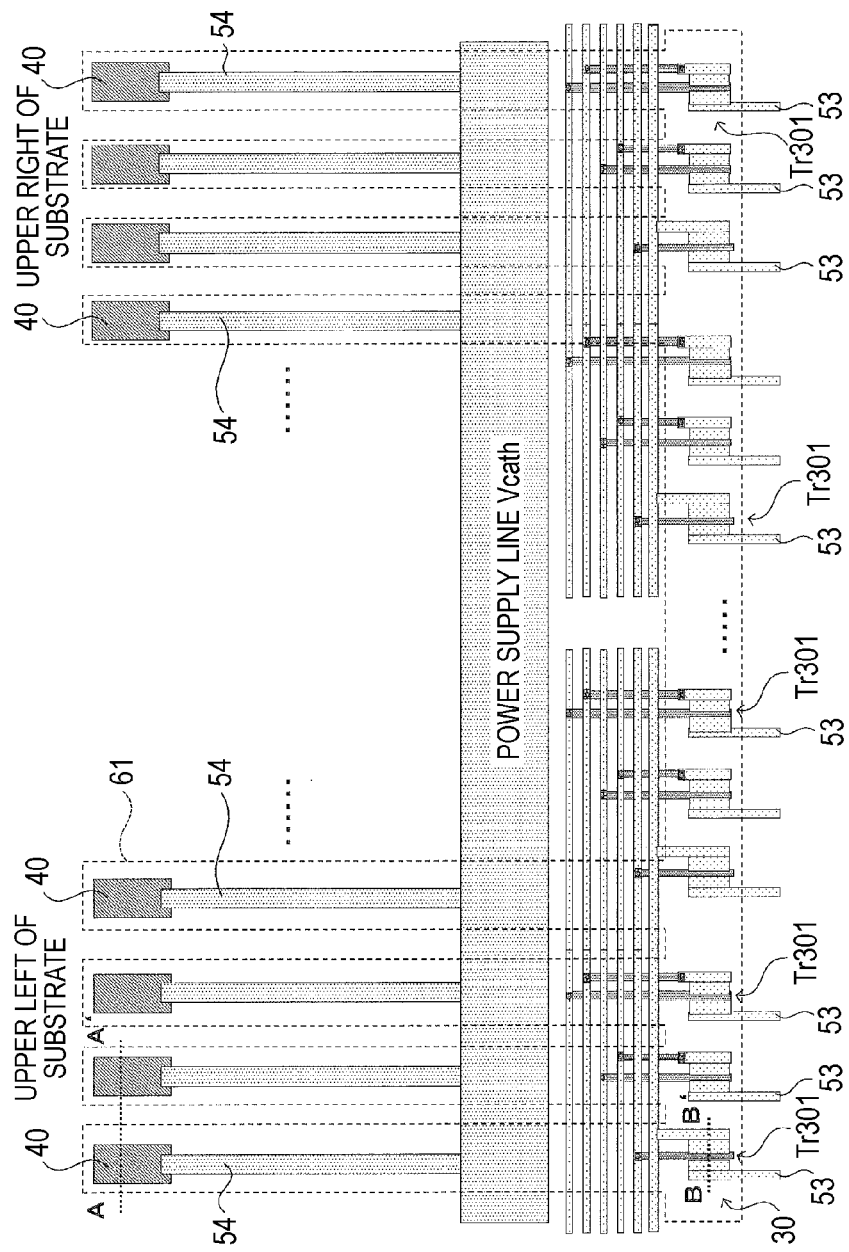
FIG. 6 is a pattern layout view used to describe a light shielding covering portion in a test switch circuit portion of the display apparatus according to the embodiment of the present invention.

FIG. 6 is a pattern layout view used to describe a light shielding covering portion in a test switch circuit portion in the display apparatus according to this embodiment. As has been described above, the test switch circuit 30 having the transistors Tr301 is provided to the signal lines 53.

In this embodiment, as indicated by a broken line in the drawing, a light shielding covering portion 61 is provided as a light shielding film to cover not only the transistors Tr301 of the test switch circuit 30 but also the connection pads 40 while electrically conducting with the connection pads 40.

The connection pads 40 electrically conducting with the light shielding covering portion 61 may not be the connection pads 40 electrically conducting with the wires (the scan lines 51 and the power supply control lines 52) connected to the protection circuits 20 as with the light shielding covering portions 61 in the protection circuits 20 described above. According to the example shown in FIG. 6, the connection pads 40 electrically conducting with the power supply feed lines 54 in the vicinity of the test switch circuit 30 are connected to the light shielding covering portion 61.

In the planar configuration of the display apparatus shown in FIG. 1, the power supply feeding flexible cables FC are connected to the right and left end portions of the glass substrate 1 on which the test switch circuit 30 is disposed, that is, the upper right and the upper left of the glass substrate 1. Accordingly, the connection pads 40 connected to the conductors of these flexible cables FC are provided at both the upper right and the upper left of the glass substrate 1.

According to the example shown in FIG. 6, the connection pads 40 are disposed at the upper right and at the upper left of the glass substrate 1. The light shielding covering portion 61 is connected to these connection pads 40 and also extends onto the transistors Tr301 of the test switch circuit 30 so as to play a role of a light shield.

As has been described, by providing the light shielding covering portion 61, not only does it become possible to shield the transistors Tr301 of the test switch circuit 30 from light, but it also becomes possible to prevent the potential of the light shielding covering portion 61 from floating. Also, by providing the light shielding covering portion 61 on the connection pad 40, it becomes possible to prevent the material of the connection pad 40 from undergoing the fabrication sequence in an exposed state.

More specifically, as with the case described above, the light shielding covering portion 61 is made of the same material in the same layer as the anode electrode, which is one of the electrodes that apply a voltage to the organic electroluminescence layer of the pixel portion 11. Owing to this configuration, the exposed material (the material of the light shielding covering portion 61) electrically conducting with the connection pads 40 is the same as the material of the anode electrodes in the developing step carried out while the anode electrodes are in an exposed state. It thus becomes possible to prevent the battery effect from being generated in the developing step or the like.

Figure 7:
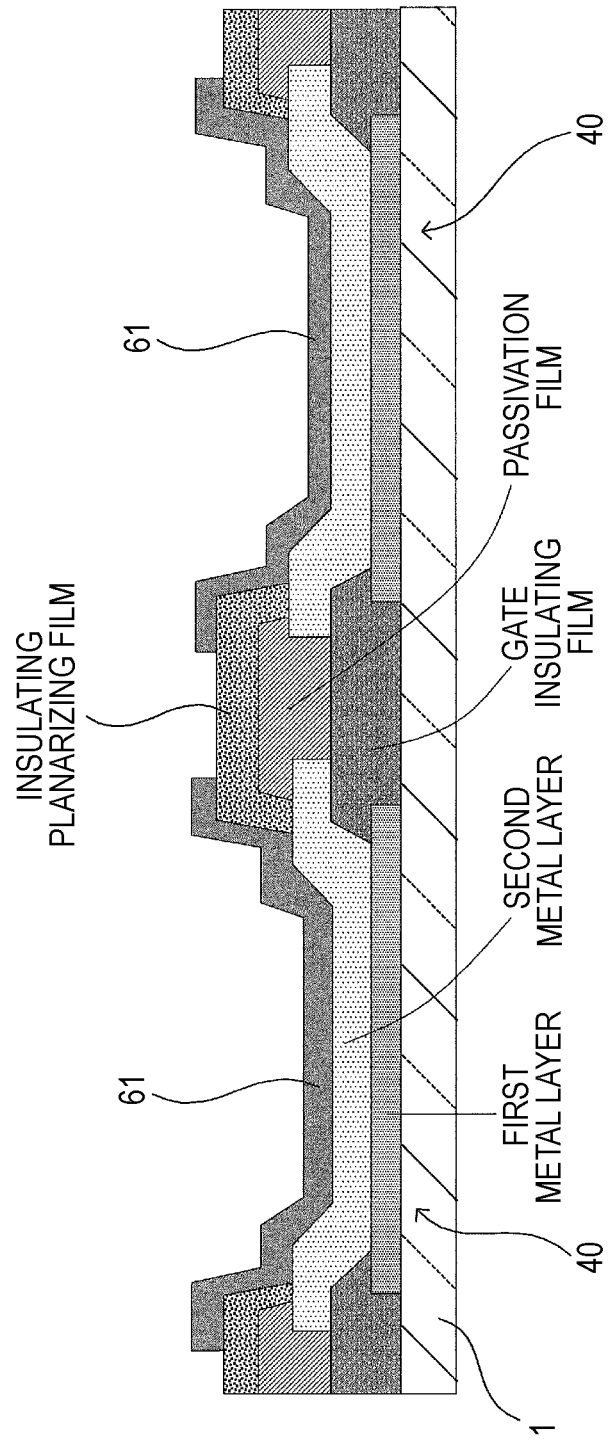
FIG. 7 is a cross section taken on line A-A' of FIG. 6.

3. Sectional Structure of Light Shielding Covering Portion Connection Pad Portion FIG. 7 is a cross section taken on line A-A' of FIG. 6. In other words, this drawing shows a cross section at the connection pad portion. The connection pads 40 are formed by patterning the first metal layer and the second metal layer on the glass substrate 1 into a predetermined shape. One connection pad 40 is isolated from an adjacent connection pad 40 by a gate insulating film or a passivation film and openings are defined by patterning an insulting planarizing film. The light shielding covering portion 61 is provided to these openings so as to electrically conduct with the second metal layer of the connection pads 40.

Titanium (Ti) is used for the second metal layer of the connection pad 40. From the viewpoint of preventing hillock or the like, the laminated structure of titanium (Ti)—Aluminum (Al)—Titanium (Ti) may be used as the second metal layer. Meanwhile, the anode electrode that applies a voltage to the organic electroluminescence layer is made of Al alloy. Accordingly, in the fabrication sequence carried out while the second metal layer and the anode electrode are in an exposed state, a current circuit is formed because of a redox potential difference between Al and Ti when the anode electrode and the second metal layer are soaked in an electrolytic peeling liquid. Hence, a battery corrosion reaction takes place, which lowers the reflectance on the surface of the anode electrode.

Lowering of the reflectance gives rise to deterioration in characteristic and reliability of the organic electroluminescence layer. The reason why is as follows. That is, when the reflectance of the anode electrode is lowered, it becomes necessary to flow a current larger than a normal current to the organic electroluminescence layer in order to obtain the luminance as high as the luminance in a case where the reflectance is not lowered. Accordingly, the organic electroluminescence layer deteriorates faster than in a normal case. In addition, power consumption of the display apparatus increases and so does heat generation.

In this embodiment, the light shielding covering portion 61 made of the same material as the anode electrode is provided on the second metal layer of the connection pads 40. Owing to this configuration, even when soaked in an electrolytic peeling liquid in the fabrication sequence carried out while the anode electrodes and the connection pads 40 are in an exposed state, a battery corrosion reaction will not take place because the anode electrodes and the second metal layer are made of the same metal. Hence, the reflectance on the surfaces of the anode electrodes is not lowered.

Switch Element Portion

Figure 8:
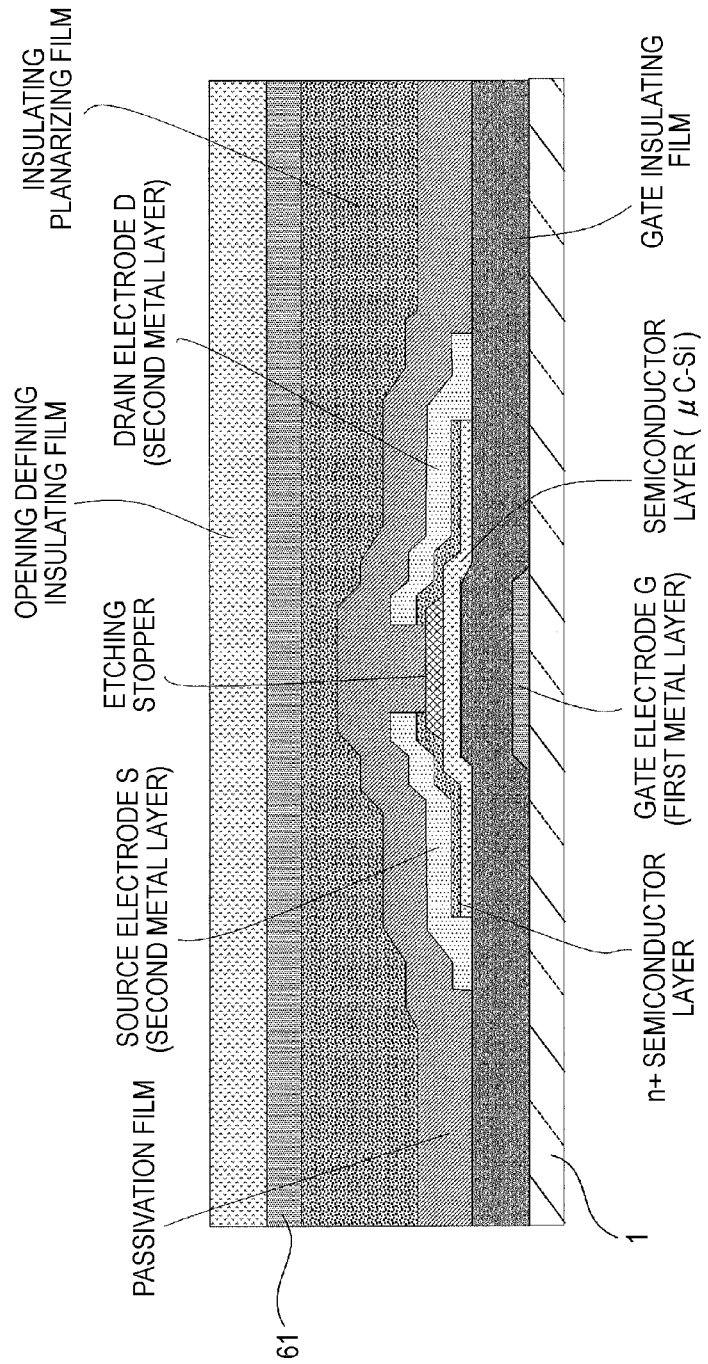
FIG. 8 is a cross section taken on line B-B' of FIG. 6.

FIG. 8 is a cross section taken on line B-B' of FIG. 6. In other words, this drawing shows a cross section of the test switch circuit 30 at the portion of the transistor Tr301. The transistor Tr301 is formed of a gate electrode (first metal layer) formed on the glass substrate 1, a semiconductor layer (μC-Si: microcrystal silicon) formed on the gate electrode via a gate insulting film, and a source electrode (second metal layer) and a drain electrode (second metal layer) formed on the gate electrode via the semiconductor layer.

An etching stopper is provided on the semiconductor layer interposed between the source electrode and the drain electrode. Also, an n+ semiconductor layer is provided between both the source electrode and the drain electrode and the semiconductor layer.

A passivation film is formed on the transistor Tr301 and an insulating planarizing film is formed on the passivation film. The surface of the insulating planarizing film is planarized and the light shielding covering portion 61 is formed on the insulating planarizing film. The light shielding covering portion 61 is made of the same material as the anode electrodes. Further, the opening defining insulating film is formed on the light shielding covering portion 61.

The sectional structure of the connection pad portion and the transistor portion described above is the same in the other connection pads and the other transistor portion of the protection circuit 20.

Figure 9:
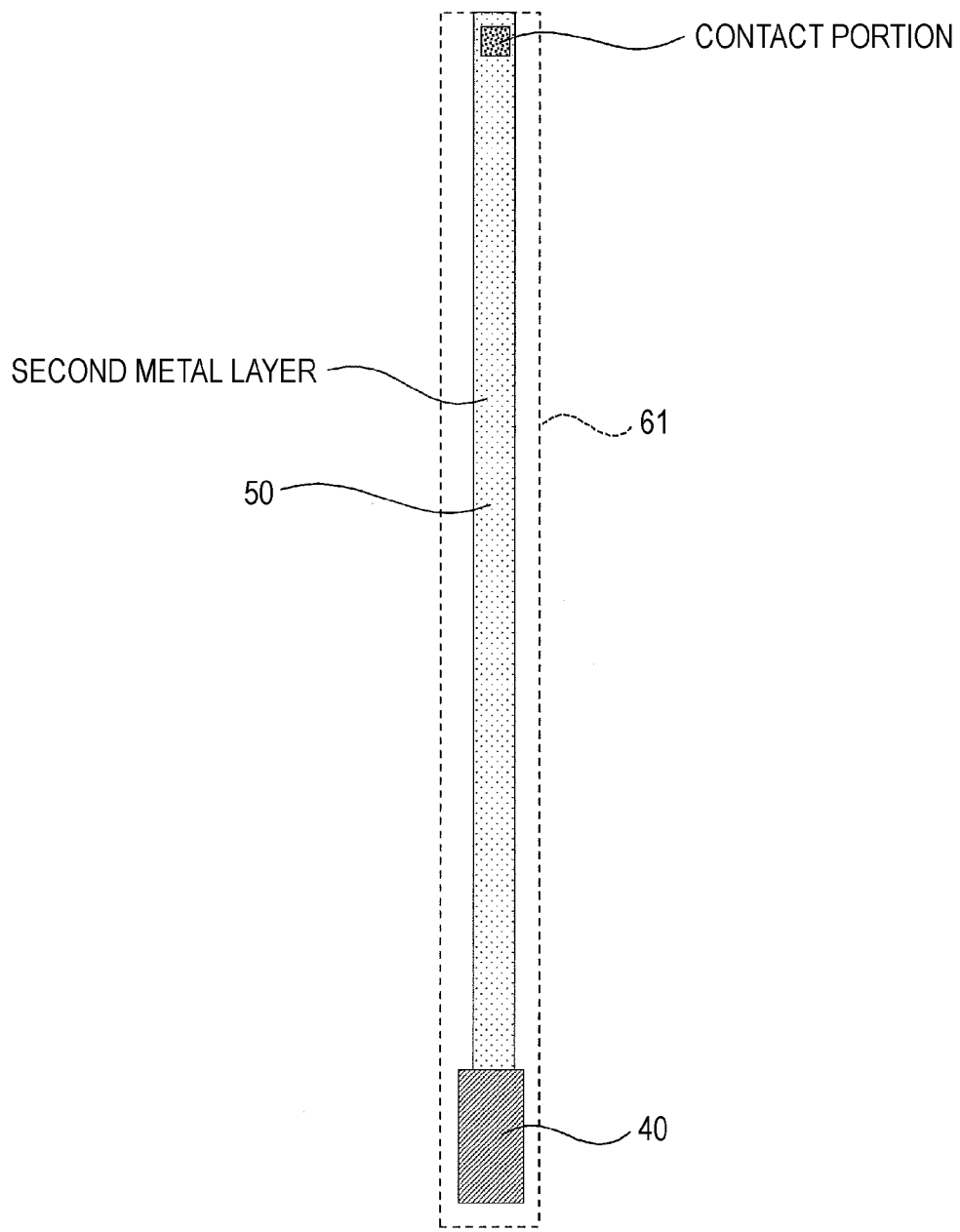
FIG. 9 is a view used to describe the planar configuration of the light shielding covering portion.

4. Planar Configuration of Light Shielding Covering Portion Routing and Connection Pad Portion FIG. 9 is a view used to describe the planar configuration of the light shielding covering portion and it shows the routing and the connection pad portion. More specifically, the light shielding covering portion 61 is formed so as to cover on the connection pad 40 while electrically conducting with the connection pad 40. The light shielding covering portion 61 is installed above the wire 50 and connected to the wire 50, which is the second metal layer, at the contact portion. By electrically conducting the wire 50 with the light shielding covering portion 61 in this manner, it becomes possible to lower the resistance value of the wire 50 in comparison with a case where the light shielding covering portion 61 is absent.

Another Example of Light Shielding Covering Potion

Figure 10:
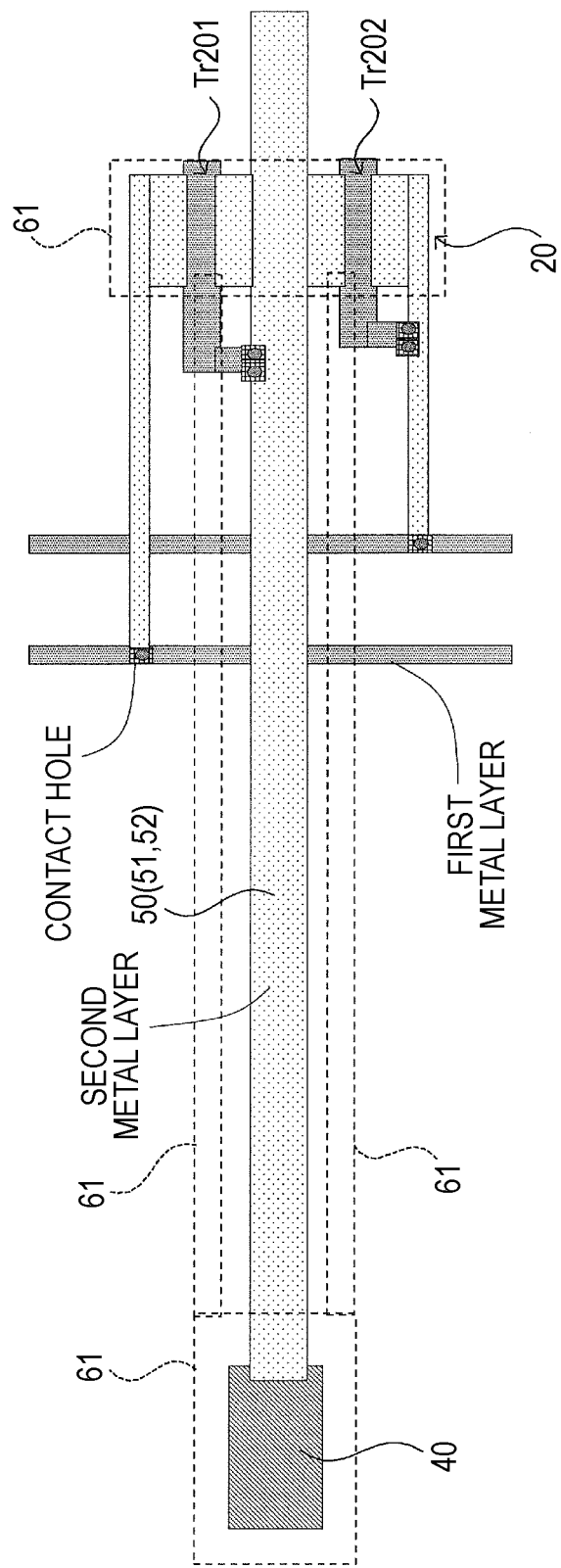
FIG. 10 is a plan view used to describe another example of the light shielding covering portion.

FIG. 10 is a plan view used to describe another example of the light shielding covering portion. This drawing shows the light shielding covering portion 61 provided on the transistors Tr201 and Tr202 of the protection circuit 20. It should be appreciated, however, that the light shielding covering portion 61 provided on the transistors in the test switch circuit 30 is of the same configuration.

The light shielding covering portion 61 is provided on the transistors Tr201 and Tr202 serving as switching elements and also on the connection pad 40. Moreover, the light shielding covering portion 61 electrically conducts with the connection pad 40. According to the example shown in FIG. 10, parts of the light shielding covering portion 61 connecting the part on the transistors Tr201 and Tr202 to the part on the connection pad 40 are not placed directly above the wire 50 but at slightly displaced positions. By placing the connection parts in this manner, it becomes possible to reduce a parasitic capacity between the wire 50 and the light shielding covering portion 61 in comparison with a case where the light shielding covering portion 61 is placed directly above the wire 50.

5. Manufacturing Method of Display Apparatus

Figure 11:
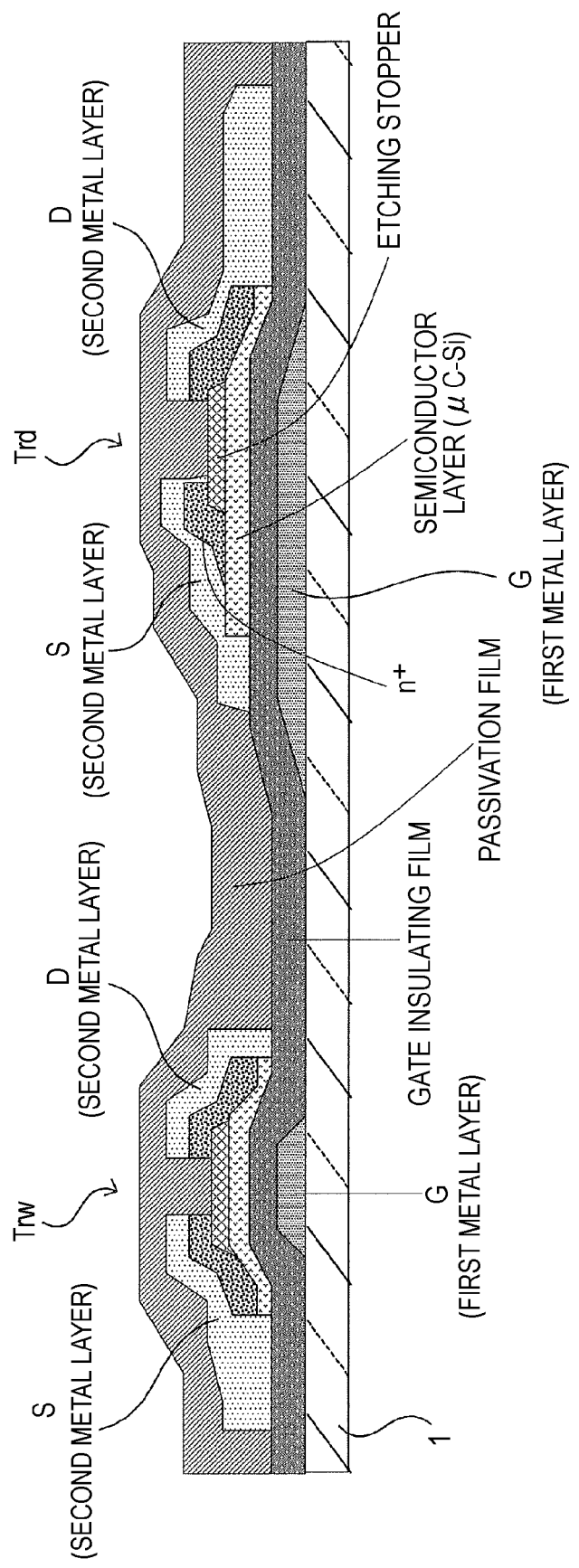
FIG. 11 is a first schematic cross section used to sequentially describe the manufacturing method of the display apparatus according to the embodiment of the present invention.

FIG. 11 through FIG. 14 are schematic cross sections used to sequentially describe the manufacturing method of the display apparatus according to this embodiment. Initially, as is shown in FIG. 11, transistors for each pixel are formed on the glass substrate 1. According to the example shown in FIG. 11, a write transistor Trw and a drive transistor Trd are formed on the glass substrate 1. More specifically, the gate electrodes G of the both transistors are formed on the glass substrate 1 from the first metal layer and a semiconductor layer (μC-Si: microcrystal silicon) is formed on the gate electrodes G via a gate insulating film. The source electrode S and the drain electrode D are formed on the semiconductor layer via an n+ semiconductor layer, which are covered with a passivation film.

Figure 12:
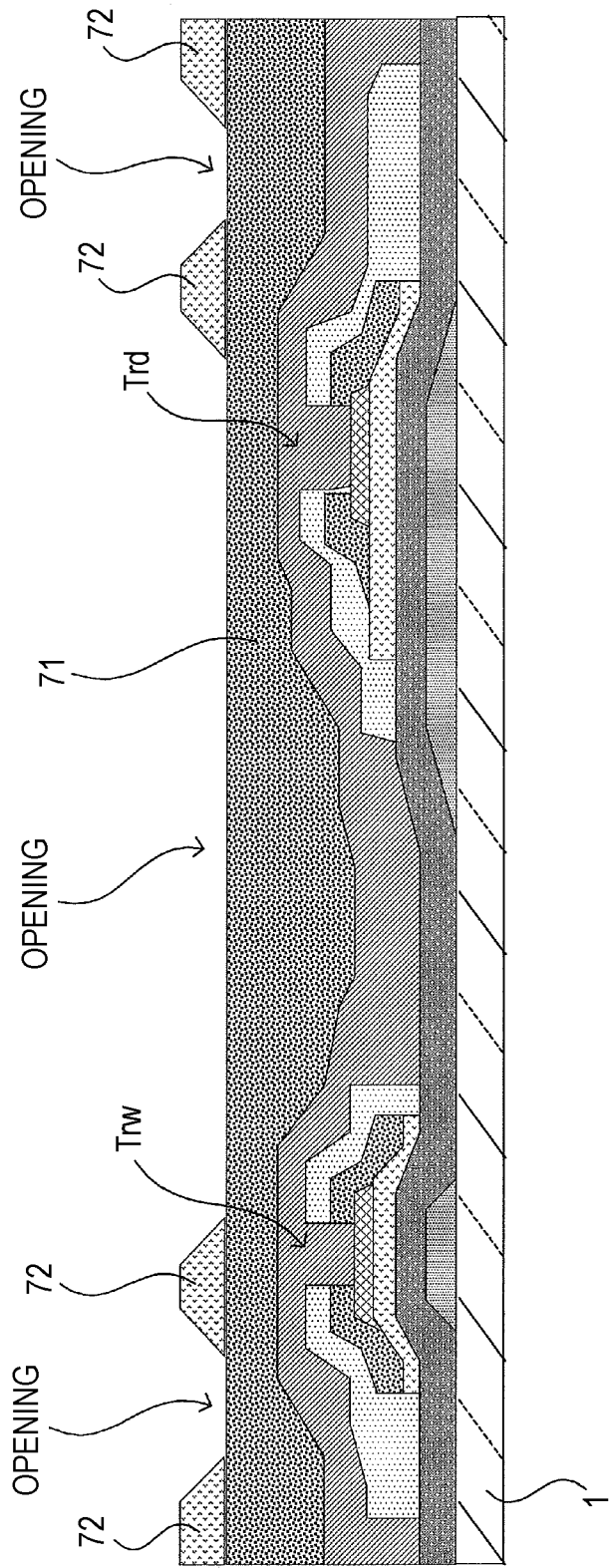
FIG. 12 is a second schematic cross section used to sequentially describe the manufacturing method of the display apparatus according to the embodiment of the present invention.

Subsequently, as is shown in FIG. 12, a first insulating film 71 is formed on the passivation film covering the write transistor Trw and the drive transistor Trd formed on the glass substrate 1. The first insulating film 71 can be made of a photosensitive organic material, such as polyimide resin, polybenzoxazole resin, novolac resin, and polyhydroxystyrene or acrylic resin. The photosensitive organic material is applied on the passivation film followed by exposure and peeling, after which the glass substrate 1 is baked. The first insulating film 71 is consequently made into an insulating planarizing film having a planarized surface.

Subsequently, a second insulating film 72 is formed on the insulating planarizing film, which is the first insulating film 71. By providing the second insulating film 72 with openings at predetermined positions, the second insulating film 72 is made into an opening defining insulating film. The second insulating film 72 can be made of a photosensitive organic material, such as polyimide resin, polybenzoxazole resin, novolac resin, and polyhydroxystyrene or acrylic resin. This material is applied on the insulating planarizing film followed by exposure and peeling. The second insulating film 72 is made into an opening defining insulating film by providing openings at the positions corresponding to the display portions of pixels and subsidiary wires.

Figure 13:
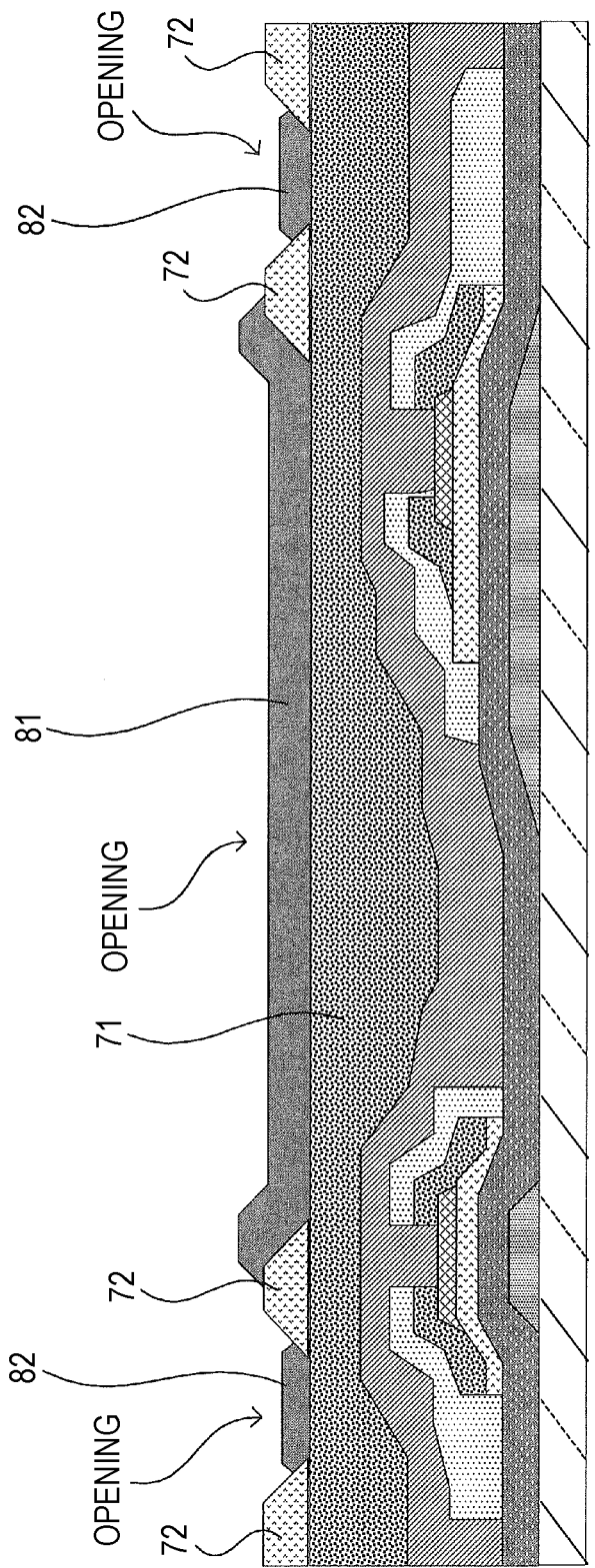
FIG. 13 is a third schematic cross section used to sequentially describe the manufacturing method of the display apparatus according to the embodiment of the present invention.

Subsequently, as is shown in FIG. 13, an anode electrode 81 and power supply subsidiary wires 82 are formed in the openings defined by the opening defining insulating film, which is the second insulating film 72. More specifically, the anode electrode 81 is formed in the opening that will be made into the display portion of a pixel and the power supply subsidiary wires 82 are formed in the openings for the power supply subsidiary wire provided on the periphery of the anode electrode 81. The anode electrode 81 and the power supply subsidiary wires 82 can be formed into a predetermined pattern by applying resist on a film of Al alloy deposited, for example, by sputtering followed by exposure, development, etching, and removal of the resist.

When the anode electrode 81 is developed via a resist film, the surfaces of the unillustrated connection pads 40 are covered with the resist film. Hence, even when the surfaces of the connection pads 40 are made of Ti, they are protected so as not to be developed. Hence, no battery effect due to a developing liquid is generated and no corrosion occurs in the anode electrode 81.

Figure 14:
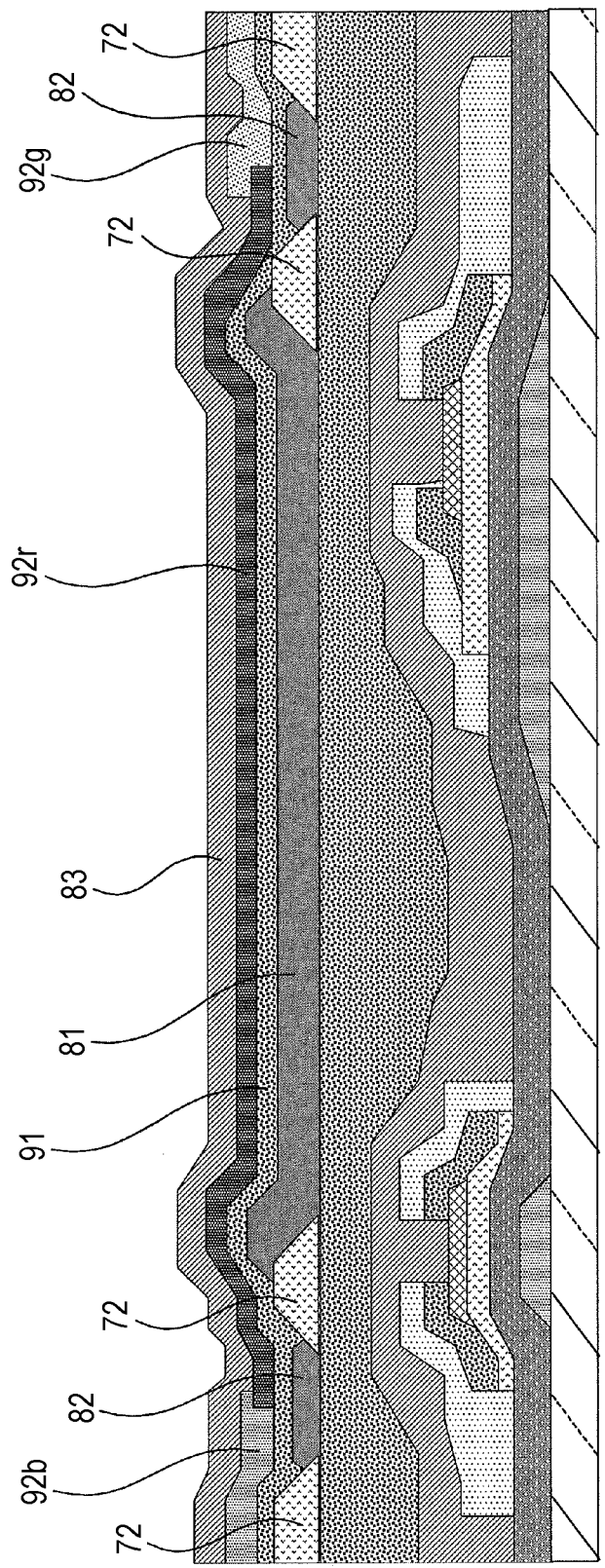
FIG. 14 is a fourth schematic cross section used to sequentially describe the manufacturing method of the display apparatus according to the embodiment of the present invention.

Subsequently, as is shown in FIG. 14, a common layer (hole injection layer and a hole transport layer) 91, which is an organic electroluminescence layer, is formed on the anode electrode 81 and the power supply subsidiary wires 82. Further, a luminous layer and an electron transport layer are formed on the common layer 91. The luminous layer and the electron transport layer are formed as a luminous layer and an electron transport layer, 92b, corresponding to B (blue), a luminous layer and an electron transport layer, 92r, corresponding to R (red), and a luminous layer and an electron transport layer, 92g, corresponding to G (green), at the positions coinciding with the respective corresponding pixels. It should be noted that the order in which to form the luminous layers and the electron transport layers, 92b, 92r, and 92g, is not particularly limited.

Subsequently, a cathode electrode 83 is formed on the luminous layers and the electron transport layers of respective colors, 92b, 92r, and 92g.

According to the manufacturing method as above, after the second insulating film 72 defining the openings for the respective pixels is formed, the anode electrode 81 is formed in the opening. It is therefore possible to prevent influences in the step of forming the second insulating film 72 from being given to the anode electrode 81. Consequently, the reflectance on the surface of the anode electrode 81 will not be lowered. Because the reflectance on the surface of the anode electrode 81 will not be lowered, it is not necessary to increase a current for unnecessarily increasing the luminance. Deterioration of the organic electroluminescence layer can be thus suppressed. In addition, it becomes possible to suppress an increase of power consumption and an increase of heat generation of the display apparatus.

Figure 15:
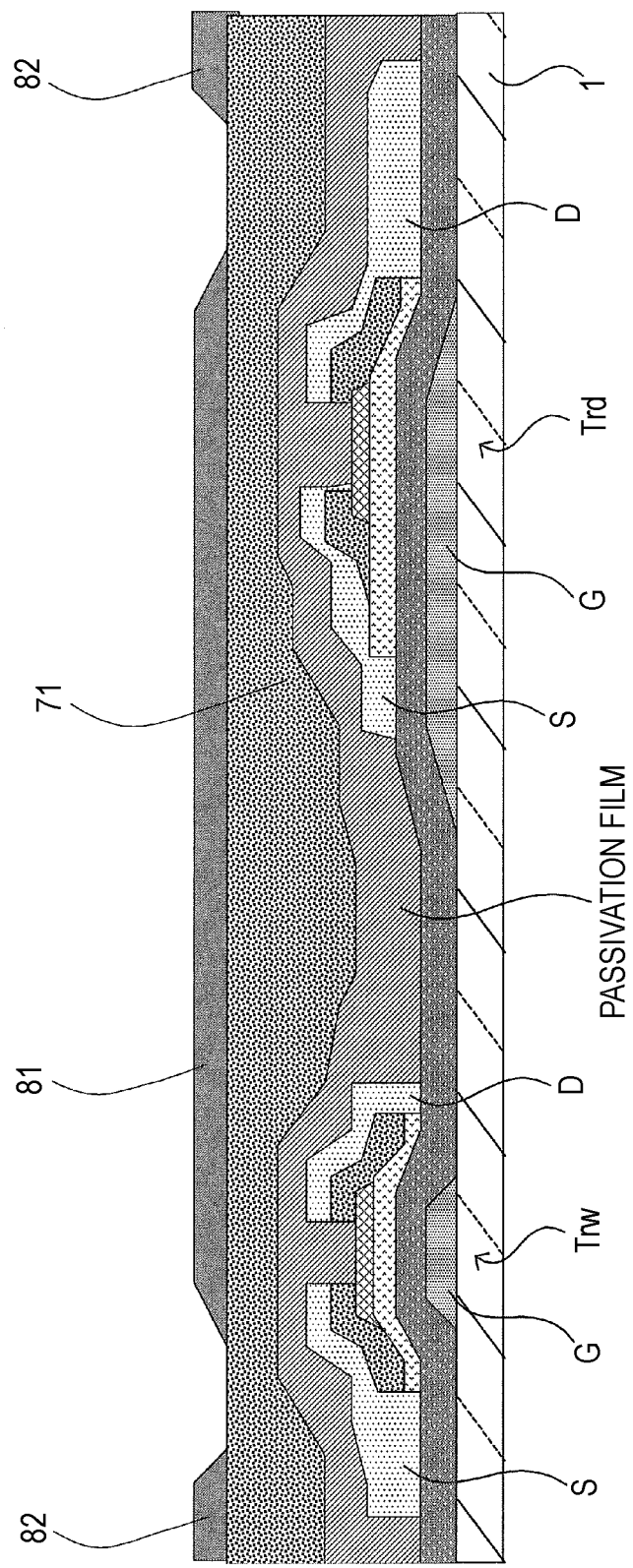
FIG. 15 is a first schematic cross section used to sequentially describe another example of the manufacturing method of the display apparatus according to the embodiment of the present invention.
Figure 16:
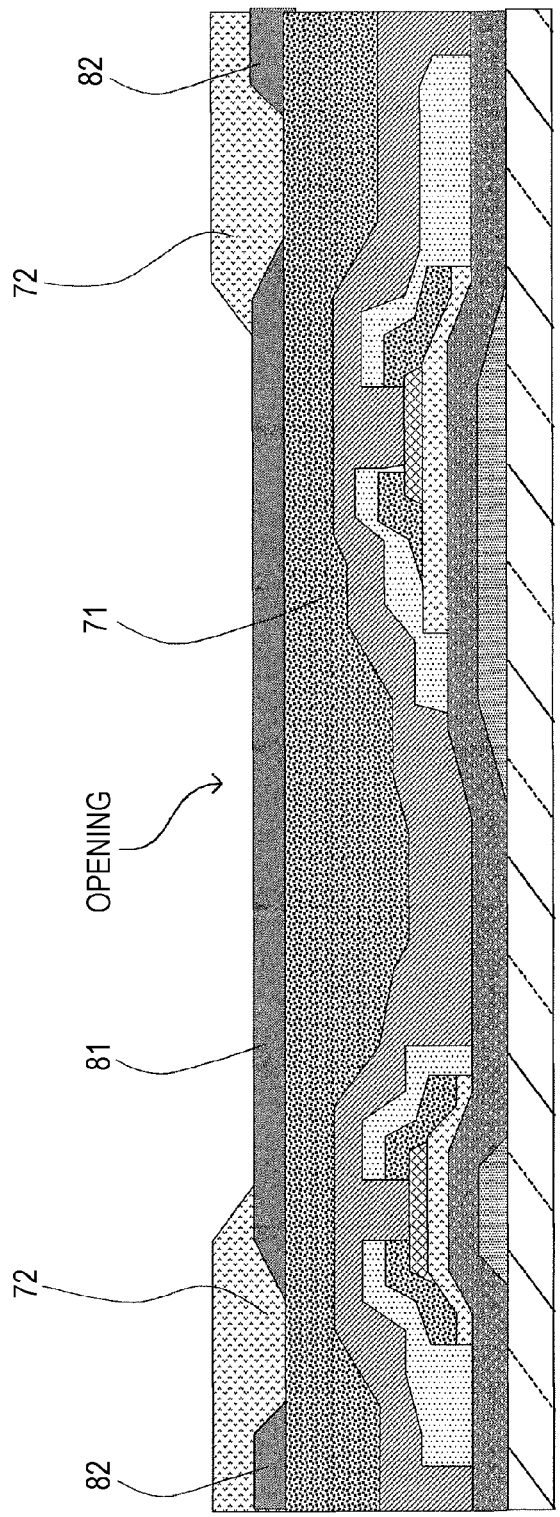
FIG. 16 is a second schematic cross section used to sequentially describe another example of the manufacturing method of the display apparatus according to the embodiment of the present invention.
Figure 17:
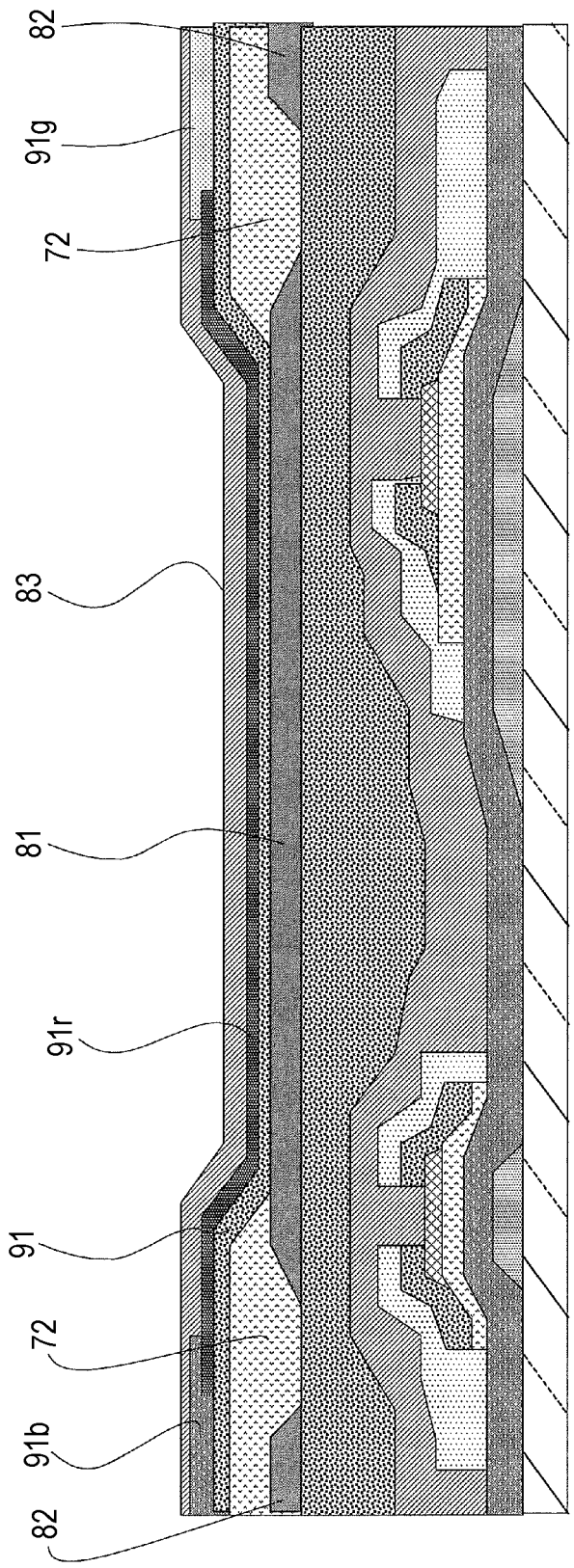
FIG. 17 is a third schematic cross section used to sequentially describe another example of the manufacturing method of the display apparatus according to the embodiment of the present invention.

Another example of the manufacturing method of the display apparatus according to this embodiment is shown in FIG. 15 through FIG. 17. Initially, as is shown in FIG. 15, transistors for each pixel are formed on the glass substrate 1. According to the example shown in FIG. 15, a write transistor Trw and a drive transistor Trd are formed on the glass substrate 1. More specifically, gate electrodes G of the both transistors are formed on the glass substrate 1 from the first metal layer and a semiconductor layer (μC-Si: microcrystal silicon) is formed on the gate electrodes G via a gate insulating film. Then, a source electrode S and a drain electrode D are formed on the semiconductor layer via an n+ semiconductor layer, which are covered with the passivation film.

Subsequently, a first insulating film 71 is formed on the passivation film covering the write transistor Trw and the drive transistor Trd formed on the glass substrate 1. The first insulating film 71 can be made of a photosensitive organic material, such as polyimide resin, polybenzoxazole resin, novolac resin, and polyhydroxystyrene or acrylic resin. The photosensitive organic material is applied on the passivation film followed by exposure and peeling, after which the glass substrate 1 is baked. The first insulating film 71 is thus made into an insulating planarizing film having a planarized surface.

Subsequently, an anode electrode 81 and power supply subsidiary wires 82 are formed on the insulating planarizing film, which is the first insulating film 71. The anode electrode 81 and the power supply subsidiary wires 82 can be formed into a predetermined pattern by applying resist on a film of Al alloy deposited, for example, by sputtering followed by exposure, development, etching, and removal of the resist.

Herein, when the anode electrode 81 and the power supply subsidiary wires 82 are formed, the same material is also provided on the surfaces of the unillustrated connection pad portion. When configured in this manner, the surfaces of the connection pads 40 are made of the same metal as the anode electrode 81 and the power supply subsidiary wires 82. Hence, no battery effect due to a developing liquid will be generated and no corrosion occurs in the anode electrode 81.

Subsequently, as is shown in FIG. 16, a second insulating film 72 is formed on the anode electrode 81 and the power supply subsidiary wires 82. By providing the second insulating film 72 with openings at the predetermined positions, the second insulating film 72 is made into the opening defining insulating film. The second insulating film 72 can be made of a photosensitive organic material, such as polyimide resin, polybenzoxazole resin, novolac resin, and polyhydroxystyrene or acrylic resin. This material is applied on the insulating planarizing film followed by exposure and peeling. The second insulating film 72 is then made into the opening defining insulating film by providing openings at positions corresponding to the display portions of pixels and subsidiary wires.

Subsequently, as is shown in FIG. 17, a common layer (hole injection layer and a hole transport layer) 91, which is an organic electroluminescence layer, is formed on the anode electrode 81 and the second insulating film 72 made into the opening defining insulating film. Further, a luminous layer and an electron transport layer are formed on the common layer 91. The luminous layer and the electron transport layer are formed as a luminous layer and an electron transport layer, 92b, corresponding to B (blue), a luminous layer and an electron transport layer, 92r, corresponding to R (red), and a luminous layer and an electron transport layer, 92g, corresponding to G (green), at the positions coinciding with the respective corresponding pixels. It should be noted that the order in which to form the luminous layers and the electron transport layers, 92b, 92r, and 92g, is not particularly limited.

Subsequently, a cathode electrode 83 is formed on the luminous layers and the electron transport layers of respective colors, 92b, 92r, and 92g.

According to this manufacturing method, as with the manufacturing method described first as above, it is possible to prevent the occurrence of corrosion on the surface of the anode electrode 81 during the development. Consequently, the reflectance on the surface of the anode electrode 81 will not be lowered. Because the reflectance on the surface of the anode electrode 81 will not be lowered, it is not necessary to increase a current for unnecessarily increasing the luminance. Deterioration of the organic electroluminescence can be thus suppressed. In addition, it becomes possible to suppress an increase of power consumption and an increase of heat generation of the display apparatus.

6. Application Examples

Electronic Device

Examples when the display apparatus according to this embodiment is applied to electronic devices will now be described.

Figure 18:
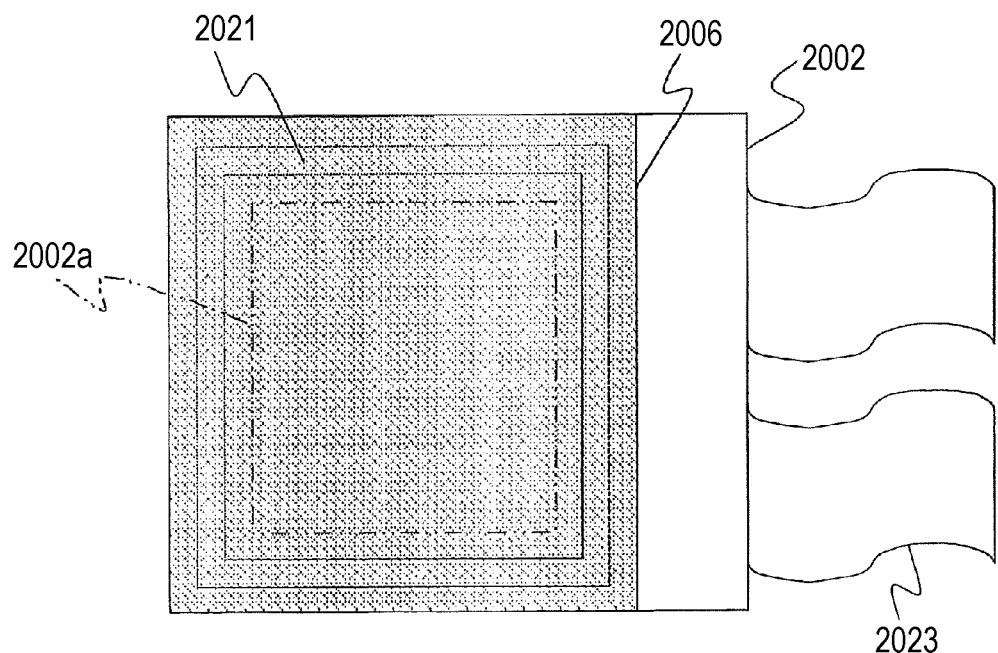
FIG. 18 is a schematic view showing an example the display apparatus of a flat modular shape.

As is shown in FIG. 18, the display apparatus according to this embodiment includes a display apparatus of a flat modular shape. For example, a display module is formed by providing a pixel array portion 2002a in which a luminous region and pixels formed of thin film transistors or the like are formed integrally in a matrix fashion on an insulating substrate 2002, placing an adhesive agent 2021 so as to surround the pixel array portion (pixel matrix portion) 2002a, and laminating a counter substrate 2006 made of glass. When the necessity arises, a color filter, a protection film, and a light shielding film, or the like may be provided to the transparent counter substrate 2006. The display module may be provided, for example, with an FPC (Flexible Printed Circuit) 2023 as a connecter to input a signal into the pixel array portion 2002a from the outside and to output a signal from the pixel array portion 2002a to the outside.

The display apparatus according to this embodiment described above is applicable to various electronic devices shown in FIG. 19 through FIG. 23G, for example, a display apparatus of an electronic device in any field that displays a video signal inputted into the electronic device or a video signal generated in the electronic device as an image or a video, more specifically, a digital camera, a notebook personal computer, a mobile terminal device, such as a mobile phone, and a video camera. In the following, an example of an electronic device to which this embodiment is applied will be described.

Figure 19:
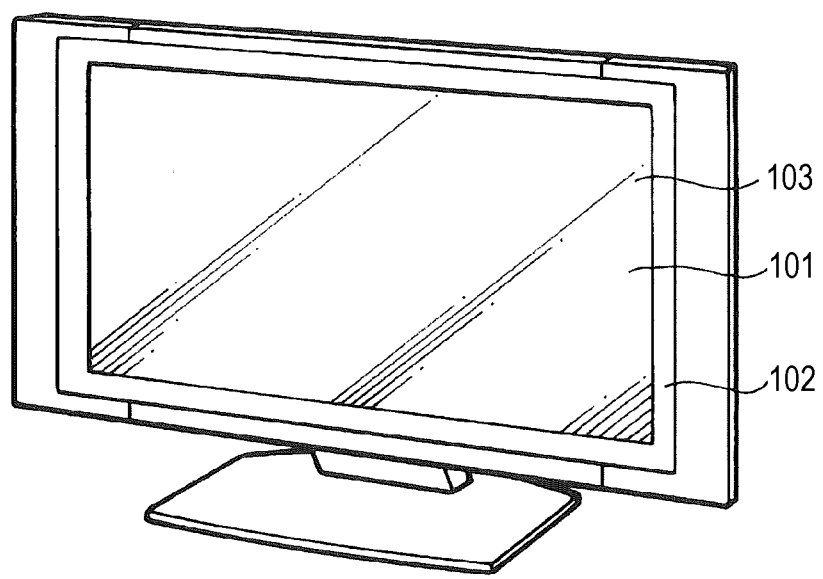
FIG. 19 is a perspective view showing a TV set to which the present invention is applied.

FIG. 19 is a perspective view of a TV set to which this embodiment is applied. The TV set as an application example includes a video display screen portion 101 formed of a front panel 102 and a filter glass 103 and employs the display apparatus of this embodiment as the video display screen portion 101.

Figure 20A:
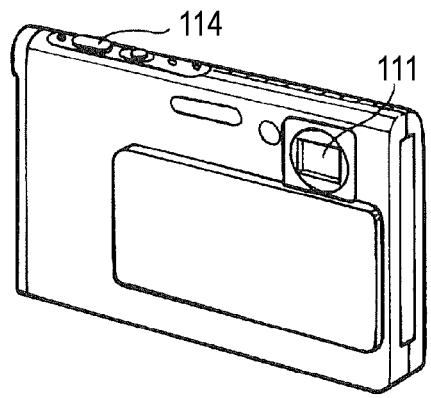
FIG. 20A and FIG. 20B are perspective views showing a digital camera to which the present invention is applied.
Figure 20B:
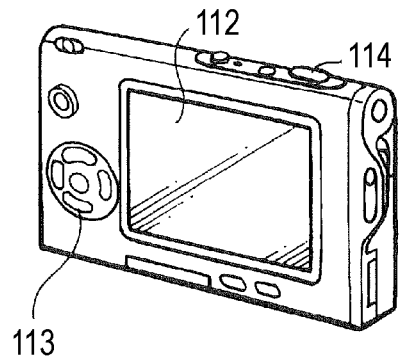

FIG. 20A and FIG. 20B are perspective views of a digital camera to which this embodiment is applied. FIG. 20A is a perspective view when viewed from the front and FIG. 20B is a perspective view when viewed from the rear. The digital camera as an application example includes a luminous portion 111 for flashlight, a display portion 112, a menu switch 113, a shutter button 114, and so forth and employs the display apparatus according to this embodiment as the display portion 112.

Figure 21:
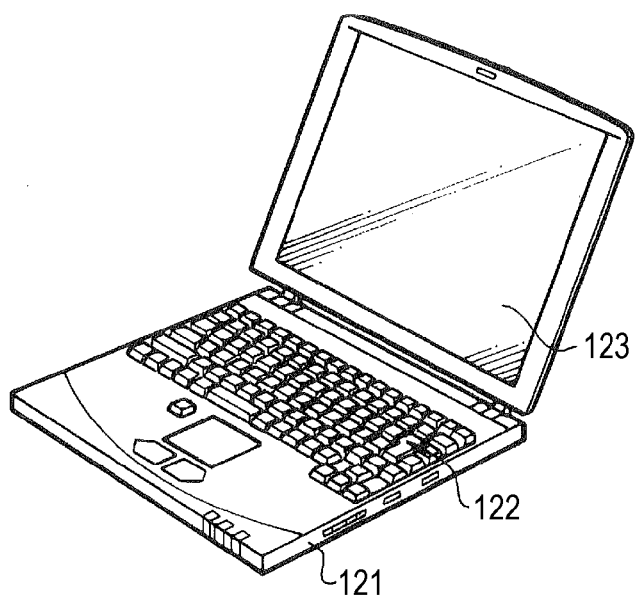
FIG. 21 is a perspective view showing a notebook personal computer to which the present invention is applied.

FIG. 21 is a perspective view showing a notebook personal computer to which this embodiment is applied. The notebook personal computer as an application example includes a main body 121 provided with a keyboard 122 operated when characters and the like are inputted, a display portion 123 on which to display an image, and so forth and employs the display apparatus of this embodiment as the display portion 123.

Figure 22:
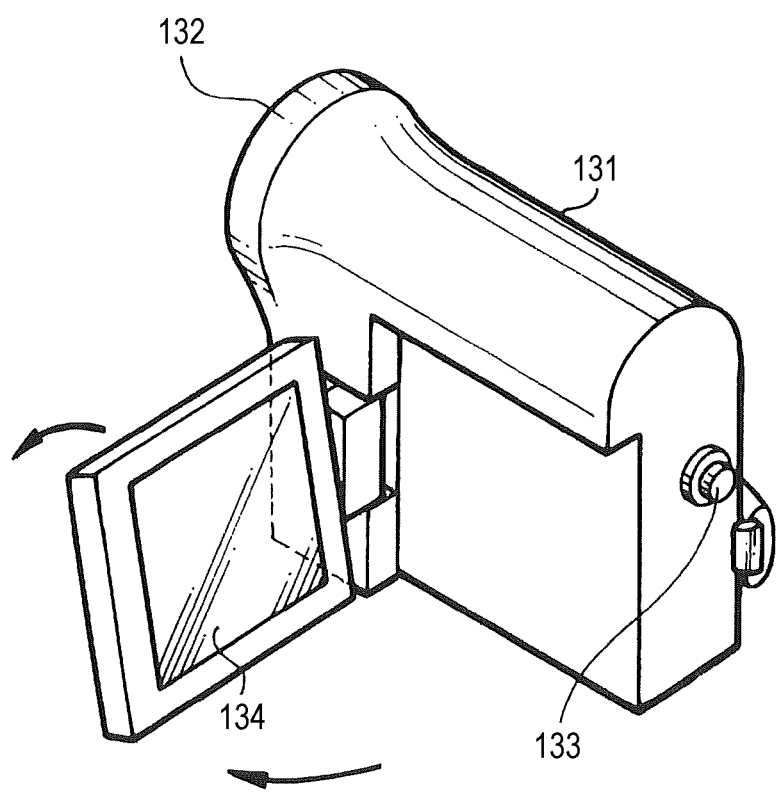
FIG. 22 is a perspective view showing a video camera to which the present invention is applied.

FIG. 22 is a perspective view showing a video camera to which this embodiment is applied. The video camera as an application example includes a main body portion 131, a subject imaging lens 132 provided on the side surface facing frontward, an imaging start and stop switch 133, a display portion 134, and so forth and employs the display apparatus according to this embodiment as the display portion 134.

FIG. 23A through FIG. 23G are views showing a mobile terminal device, for example, a mobile phone, to which this embodiment is applied. FIG. 23A is a front view of the mobile phone in an opened state and FIG. 23B is a side view in an opened state. FIG. 23C is a front view of the mobile phone in a closed state. FIG. 23D is a left side view, FIG. 24E is a right side view, FIG. 23F is a top view, and FIG. 23G is a bottom view in a closed state. The mobile phone as an application example includes an upper casing 141, a lower casing 142, a link portion (herein, a hinge portion) 143, a display 144, a sub-display 145, a picture light 146, a camera 147, and so forth and employs the display apparatus according to this embodiment as the display 144 and the sub-display 145.

The present application contains subject matter related to that disclosed in Japanese Priority Patent Application JP 2009-028050 filed in the Japan Patent Office on Feb. 10, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display apparatus comprising:
a display region including a plurality of pixel portions;
wires connected to respective pixel portions within the display region from an outside of the display region and providing a signal to drive the respective pixel portions;
connection pads provided on the outside of the display region, the connection pads electrically connected with the wires and serving as input portions via which the signal is provided to the wires;
switch elements provided on the outside of the display region and connected in a middle of the wires; and
a light shielding covering portion that is formed over the switch elements to shield the switch elements from light, and that is also formed on the connection pads such that the light shielding covering portion covers the connection pads and is electrically connected to the connection pads.

2. The display apparatus according to claim 1, wherein:
each of the plurality of pixel portions includes an organic electroluminescence layer interposed between an anode electrode and a cathode electrode, and
the light shielding covering portion is made of a material that is same as a material from which the anode electrode is made of.

3. The display apparatus according to claim 1, wherein the switch elements are elements provided to protect transistors that drive the respective pixel portions.

4. The display apparatus according to claim 1, wherein the switch elements are elements used during a performance test of transistors that drive the respective pixel portions.

5. The display apparatus according to claim 1, wherein the wires are scan lines to provide a signal to sequentially select transistors that drive the respective pixel portions.

6. The display apparatus according to claim 1, wherein the wires are power supply control lines to provide a control signal of a power supply voltage to transistors that drive the respective pixel portions.

7. The display apparatus according to claim 1, wherein the wires are signal lines to provide a video signal to transistors that drive the respective pixel portions.

8. An electronic device comprising:
- a display apparatus in a main body casing, the display apparatus including
  - a display region including a plurality of pixel portions,
  - wires connected to respective pixel portions within the display region from an outside of the display region and providing a signal to drive the respective pixel portions,
- connection pads provided on the outside of the display region, the connection pads electrically connected with the wires and serving as input portions via which the signal is provided to the wires,
- switch elements provided on the outside of the display region and connected in a middle of the wires, and
- a light shielding covering portion that is formed over the switch elements to shield the switch elements from light, and that is also formed on the connection pads such that the light shielding covering portion covers the connection pads and is electrically connected to the connection pads.

* * * * *